(12) United States Patent
Shima

(10) Patent No.: US 8,697,531 B2
(45) Date of Patent: Apr. 15, 2014

(54) METHOD FOR FABRICATING A SEMICONDUCTOR DEVICE HAVING STRESS/STRAIN AND PROTRUSION

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/459,305

(22) Filed: Apr. 30, 2012

(65) Prior Publication Data
US 2012/0214287 A1 Aug. 23, 2012

Related U.S. Application Data

(60) Division of application No. 12/651,606, filed on Jan. 4, 2010, now abandoned, which is a continuation of application No. PCT/JP2007/063883, filed on Jul. 12, 2007.

(51) Int. Cl.
| | | |
|---|---|---|
| *H01L 21/02* | (2006.01) | |
| *H01L 21/70* | (2006.01) | |
| *H01L 21/336* | (2006.01) | |
| *H01L 21/265* | (2006.01) | |
| *H01L 29/66* | (2006.01) | |
| *H01L 29/78* | (2006.01) | |

(52) U.S. Cl.
USPC ........... 438/305; 438/300; 438/303; 438/301; 438/299; 438/589; 257/E21.001; 257/E21.345; 257/E21.431

(58) Field of Classification Search
USPC .......... 438/300, 303, 589, 301, 299; 257/E21.345, E21.431, E21.438, 257/E21.444, E29.267
See application file for complete search history.

(56) References Cited

U.S. PATENT DOCUMENTS 5,508,225 A * 4/1996 Kadoiwa .................... 438/40
5,972,726 A * 10/1999 Saitoh et al. .............. 438/14

(Continued)

FOREIGN PATENT DOCUMENTS

| JP | 10-163491 A | 6/1998 |
|---|---|---|
| JP | 10-242416 A | 9/1998 |

(Continued)

OTHER PUBLICATIONS

Japanese Office Action dated Jul. 24, 2012, issued in corresponding Japanese Patent Application No. 2009-522480, (7 pages). With English Translation.

(Continued)

*Primary Examiner* — Ha Tran T Nguyen
*Assistant Examiner* — Thai T Vuong
(74) *Attorney, Agent, or Firm* — Westerman, Hattori, Daniels & Adrian, LLP

(57) ABSTRACT

A semiconductor device includes a silicon substrate having a protrusion, a gate insulating film formed over an upper surface of the protrusion of the silicon substrate, a gate electrode formed over the gate insulating film, a source/drain region formed in the silicon substrate on the side of the gate electrode, a first side wall formed over the side surface of the protrusion of the silicon substrate, the first side wall containing an insulating material, a second side wall formed over the first side wall, the second side wall having a bottom portion formed below the upper surface of the protrusion of the silicon substrate, the second side wall containing a material having a Young's modulus greater than that of the silicon substrate, and a stress film formed over the gate electrode and the second side wall.

6 Claims, 11 Drawing Sheets

(56) References Cited

U.S. PATENT DOCUMENTS

| | | | |
|---|---|---|---|
| 6,010,936 A * | 1/2000 | Son | 438/303 |
| 6,406,973 B1 * | 6/2002 | Lee | 438/416 |
| 6,939,751 B2 * | 9/2005 | Zhu et al. | 438/151 |
| 7,682,916 B2 * | 3/2010 | Murthy et al. | 438/300 |
| 2001/0016393 A1 | 8/2001 | Son | |
| 2003/0040158 A1 * | 2/2003 | Saitoh | 438/279 |
| 2005/0269650 A1 | 12/2005 | Pidin | |
| 2006/0180866 A1 | 8/2006 | Zhu et al. | |
| 2006/0220113 A1 | 10/2006 | Tamura et al. | |
| 2006/0231826 A1 | 10/2006 | Kohyama | |
| 2006/0281288 A1 | 12/2006 | Kawamura et al. | |
| 2008/0020533 A1 * | 1/2008 | Thei et al. | 438/286 |
| 2008/0020536 A1 * | 1/2008 | Zhu | 438/301 |
| 2008/0173942 A1 | 7/2008 | Zhu et al. | |
| 2008/0237726 A1 * | 10/2008 | Dyer | 257/369 |

FOREIGN PATENT DOCUMENTS

| | | |
|---|---|---|
| JP | 2002-176174 A | 6/2002 |
| JP | 2004-221245 A | 8/2004 |
| JP | 2005-057301 A | 3/2005 |
| JP | 2005-109064 A | 4/2005 |
| JP | 2005-353675 A | 12/2005 |
| JP | 2006-278776 A | 10/2006 |
| JP | 2006-303501 A | 11/2006 |
| JP | 2006-351581 A | 12/2006 |
| JP | 2007-005621 A | 1/2007 |

OTHER PUBLICATIONS

International Search Report of PCT/JP2007/063883, mailing date of Oct. 16, 2007.

* cited by examiner

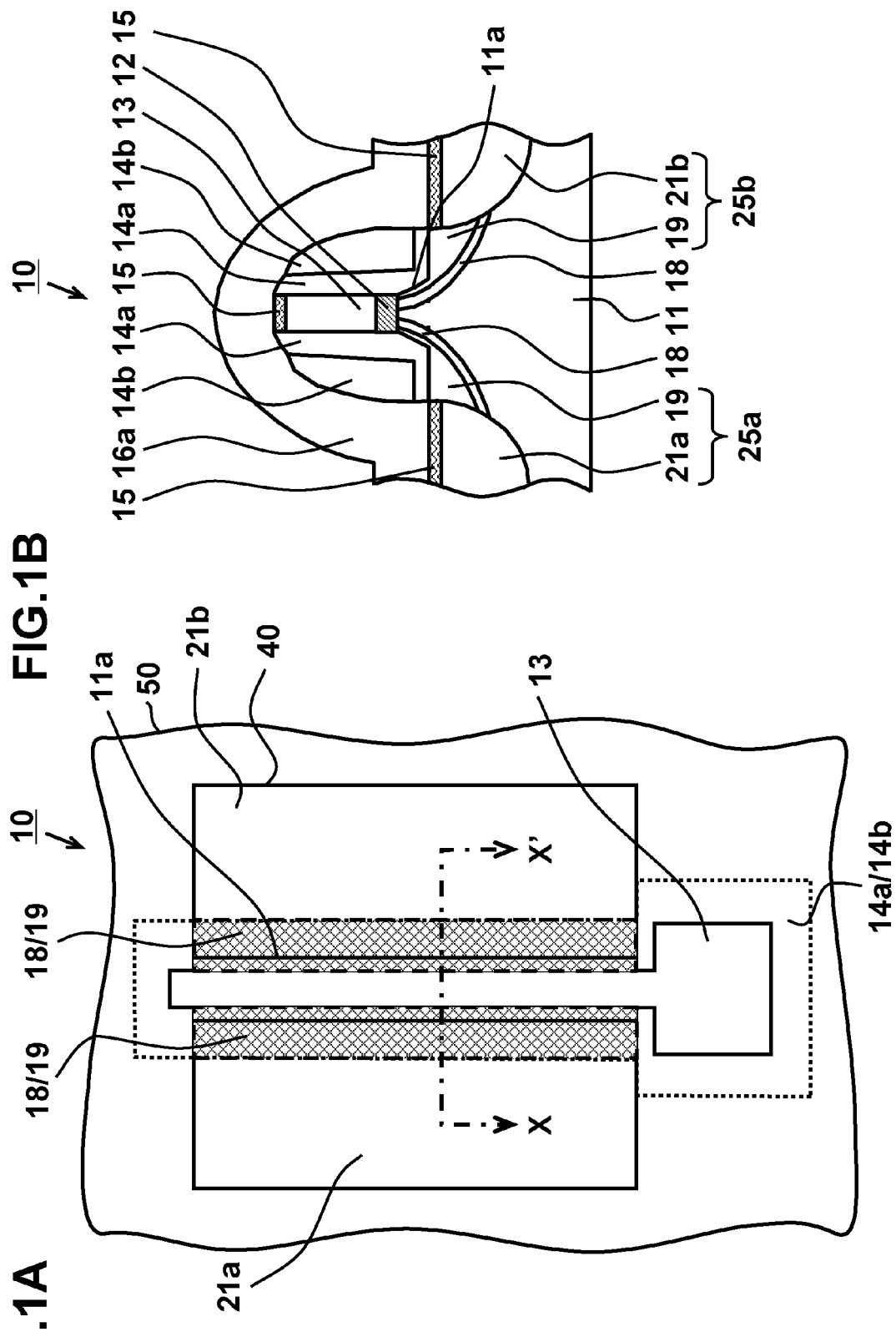

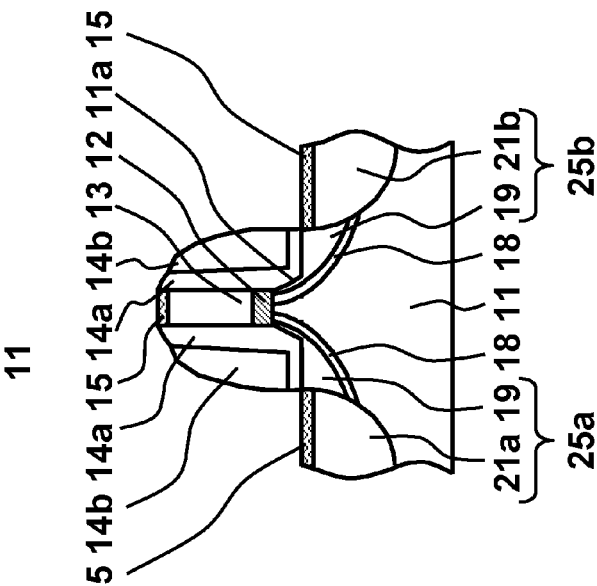
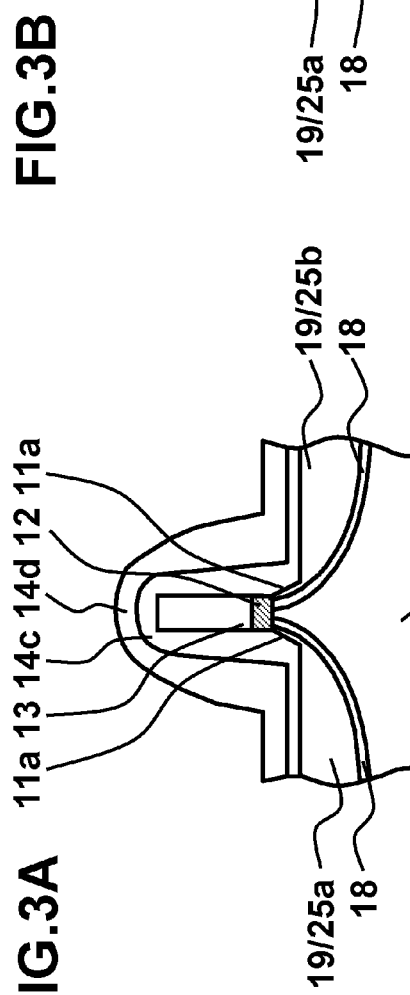
FIG.3A  FIG.3B
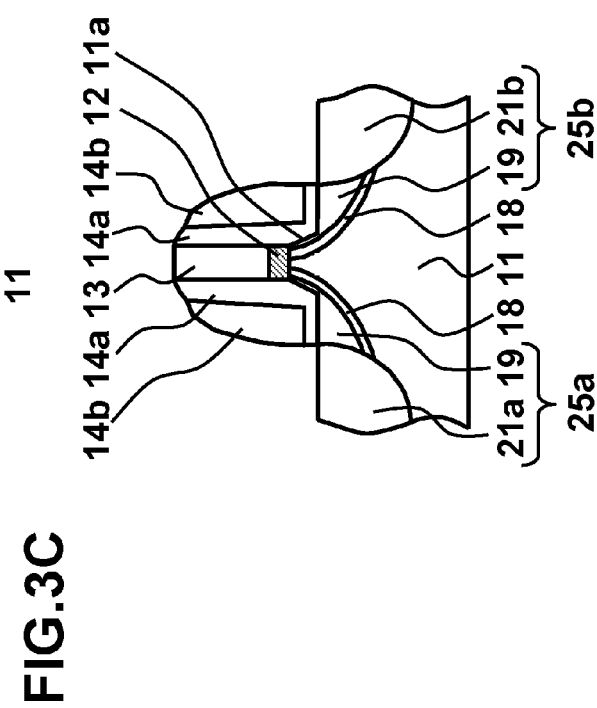
FIG.3C  FIG.3D

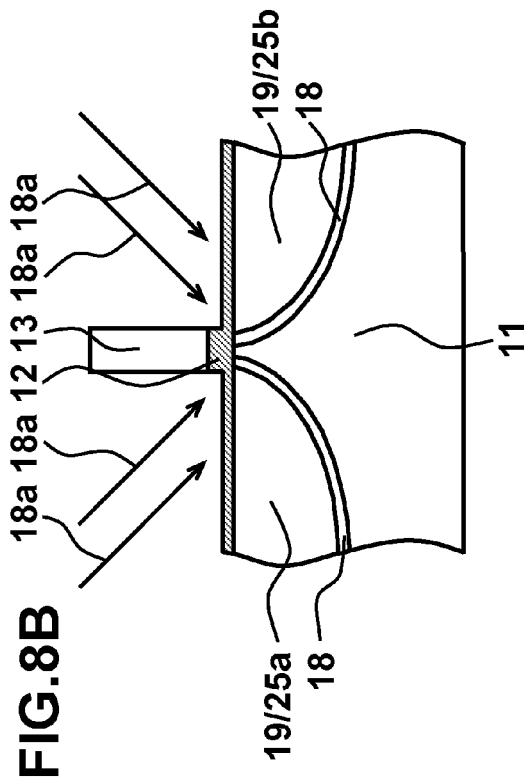
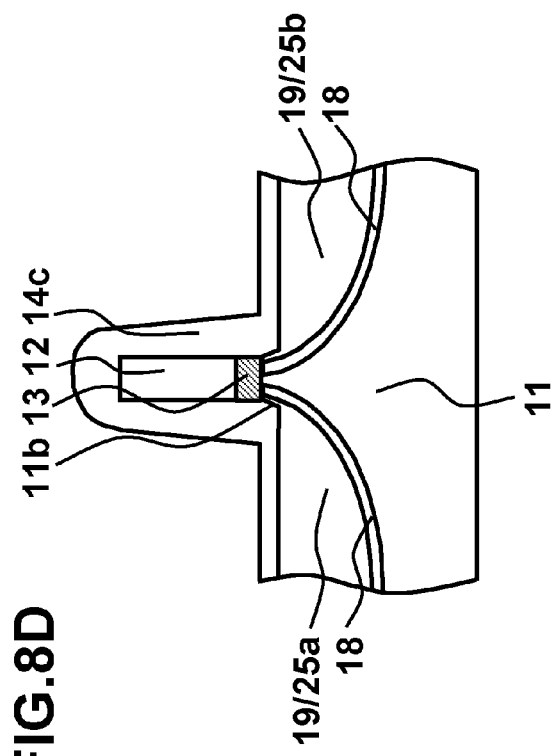
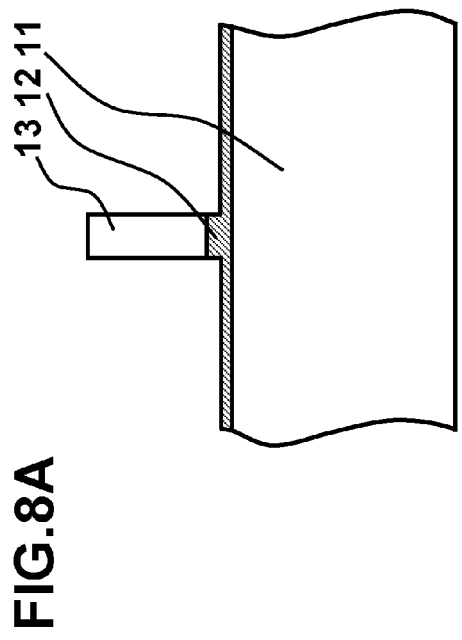
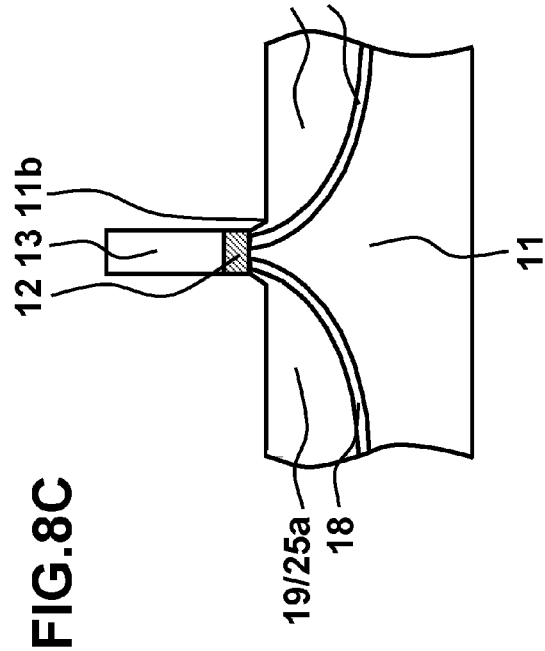

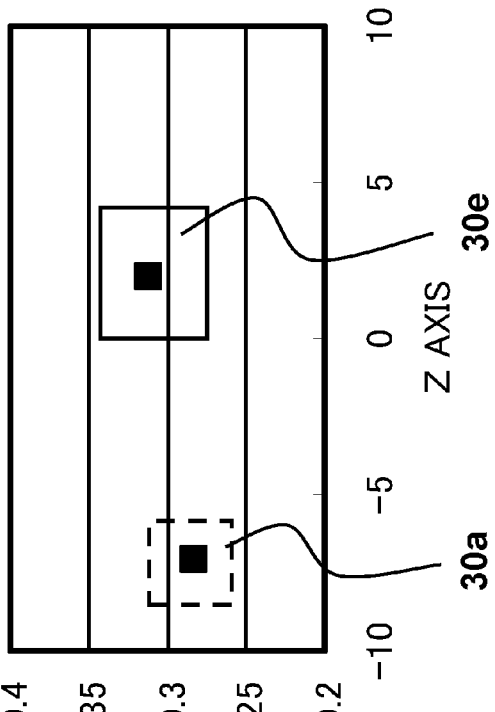
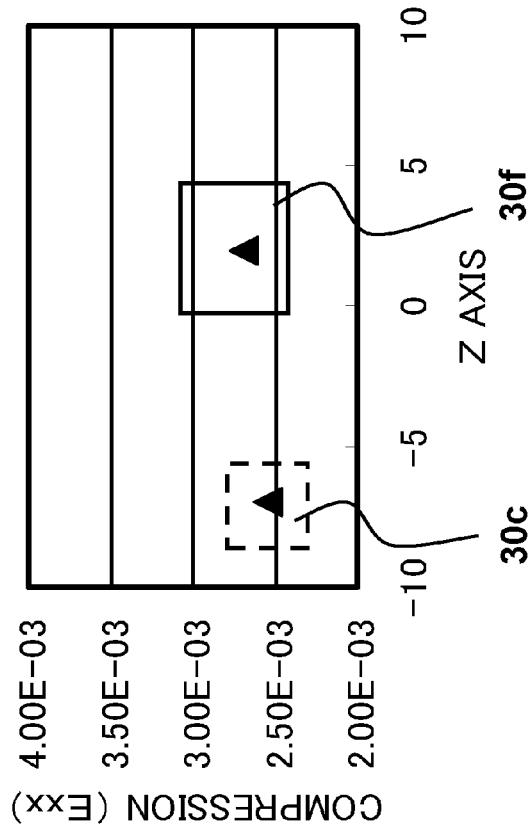
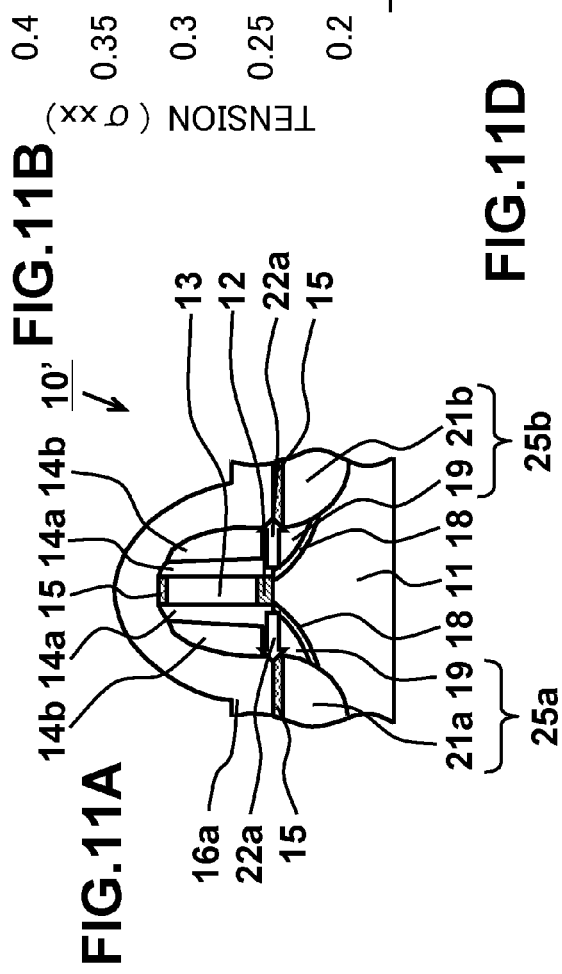

METHOD FOR FABRICATING A SEMICONDUCTOR DEVICE HAVING STRESS/STRAIN AND PROTRUSION

CROSS-REFERENCE TO RELATED APPLICATION

This application is a Divisional of copending application Ser. No. 12/651,606, filed Jan. 4, 2010, which is a Continuation of copending PCT International Application No. PCT/JP2007/063883 filed on Jul. 12, 2007. The entire contents of each of the above documents is hereby incorporated by reference into the present application.

FIELD

An aspect of the embodiments discussed herein is directed to a method of manufacturing a semiconductor device including a film for providing increased channel stress of a field-effect transistor.

BACKGROUND

A technique has been known in which the crystals of the channel region of a semiconductor device including a field-effect transistor are distorted to increase the carrier mobility. For example, a method has been proposed for forming a stress film covering the field-effect transistor so that a predetermined stress may be produced in the channel region.

The field-effect transistor has a structure having side walls that electrically separate the gate electrode from the source and drain regions when the gate electrode, the source region and the drain region are formed. The side walls are formed on the side surfaces of the gate electrode and at both ends of the channel region.

A side wall having a small width may increase the stress produced in the channel region by the stress film, and may increase the carrier mobility accordingly. However, the side wall having a small width may not maintain sufficient insulation between the gate electrode and the source region or between the gate electrode and the drain region.

For example, Japanese Laid-open Patent Publication No. 2005-057301 discusses that grooves are formed so as to extend to the portions under the side walls from the surfaces of the source and drain regions formed at both sides of the side walls, and are filled with a stress film. By forming grooves near the channel region, the distance between the stress film and the channel region may be reduced independent of the width of the side wall.

SUMMARY

According to an aspect of an embodiment, a semiconductor device includes a silicon substrate including a protrusion, a gate insulating film formed over an upper surface of the protrusion of the silicon substrate, a gate electrode formed over the gate insulating film, a source/drain region formed in the silicon substrate, a first side wall formed over the side surface of the protrusion of the silicon substrate, the first side wall containing an insulating material, a second side wall formed over the first side wall, the second side wall having a bottom portion formed below the upper surface of the protrusion of the silicon substrate, the second side wall containing a material having a Young's modulus greater than that of the silicon substrate, and a stress film formed over the gate electrode and the second side wall.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B are representations illustrating the structure of an n-type MIS transistor according to a first embodiment;

FIGS. 3A-3D are representations of sectional views illustrating the method of manufacturing the n-type transistor according to the first embodiment;

FIGS. 8A-8D are representations of sectional views illustrating a method of manufacturing the n-type transistor according to the second embodiment;

FIGS. 11A-11D are representations illustrating the improvement of the stress and distortion in the n-type MIS transistor according to the second embodiment.

DESCRIPTION OF EMBODIMENTS

Figure 2A:
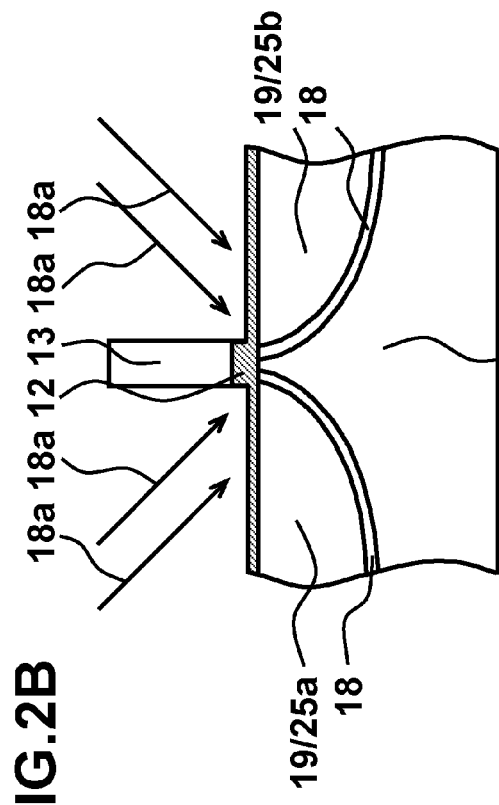
FIGS. 2A-2D are representations of sectional views illustrating a method of manufacturing the n-type transistor according to the first embodiment.

As described previously, the side wall in the structure discussed in Patent Document 1 is however made of silicon oxide ($SiO_2$). Silicon oxide ($SiO_2$) has a lower Young's modulus than silicon (Si) forming the substrate of the field-effect transistor. Consequently, stress produced by the stress film is absorbed by the deflection of the side wall. The stress produced by the stress film may not be efficiently transmitted to the channel region.

A first embodiment and a second embodiment will now be described. However, the present technique is not limited to the embodiments.

FIGS. 1 to 6 are detailed representations of the structure of an n-type MIS transistor 10 according to a first embodiment and a method of manufacturing the n-type MIS transistor 10. In the MIS transistor and the method of manufacturing the MIS transistor according the first embodiment, a second side wall 14b having a higher Young's modulus than the p-type silicon (Si) substrate 11 is formed at both ends of the channel region. By forming the second side wall 14b at both ends of the channel region, the uniaxial stress in the channel region may be increased.

FIG. 1 illustrates the structure of the n-type MIS transistor 10 of the first embodiment. FIG. 1A is a plan view of the n-type MIS transistor 10. FIG. 1B is a sectional view taken along line X-X' in FIG. 1A.

In FIG. 1A, reference numeral 11a denotes a protrusion; 13 denotes a gate electrode; 14a denotes a first side wall; 14b denotes a second side wall; 18 denotes a pocket region; 19 denotes an extension region; 21a denotes a deep source region; 21b denotes a deep drain region; 40 denotes an active region; and 50 denotes an element isolation region. The n-type MIS transistor 10 is an example of the semiconductor device.

As illustrated in FIG. 1A, the element isolation region 50 is formed around the n-type MIS transistor 10. The active region 40 is a rectangular region defined by the element isolation region 50. The gate electrode 13 extends across the center of the active region 40. The first side wall 14a and the second side wall 14b are formed around the gate electrode 13. The pocket regions 18 and the extension regions 19 are formed to predetermined widths along the gate electrode 13 in the active region 40. The gate electrode 13 is formed over the protrusion 11a. The deep source region 21a and the deep drain region 21b are formed in the entire active region 40 except the gate electrode 13, pocket regions 18 and extension regions 19.

In FIG. 1B, reference numeral 11 denotes a p-type silicon (Si) substrate; 11a denotes the protrusion; 12 denotes a gate insulating layer; 13 denotes the gate electrode; 14a denotes the first side wall; 14b denotes the second side wall; 15 denotes a silicide layer; 16a denotes a stress film; 18 denotes the pocket region; 19 denotes the extension region; 21a denotes the deep source region; and 21b denotes the deep drain region. In FIG. 1B, the same parts as those in FIG. 1A are designated by the same reference numerals.

The protrusion 11a is formed on the p-type silicon (Si) substrate 11. The protrusion 11a has an upper surface and a side surface. Preferably, the side surface of the protrusion 11a is inclined from the direction perpendicular to the major surface of the p-type silicon (Si) substrate 11. Preferably, the inclination of the side surface of the protrusion 11a is 30 to 60 degrees. The protrusion 11a has a height of about 10 nm to 20 nm.

The gate insulating layer 12 is formed on the protrusion 11a of the p-type silicon (Si) substrate 11. The gate insulating layer 12 has a thickness of, for example, about 1 nm to 2 nm.

The gate electrode 13 is formed to a height of, for example, about 100 nm on the gate insulating layer 12. Polysilicon (Si) may be used for the gate electrode 13.

The source region 25a and the drain region 25b are provided in the protrusion 11a of the p-type silicon (Si) substrate 11. The extension regions 19 are part of the source region 25a and the drain region 25b. Preferably, the extension regions 19 are formed to a width of, for example, 40 nm to 60 nm respectively from one edge and the opposite edge of the p-type silicon (Si) substrate 11 in the region where the gate insulating layer 12 is disposed, and to a depth of at most 20 nm to 60 nm from the surface of the p-type silicon (Si) substrate. The width of the extension regions 19 depends on the widths of the below-described first side wall 14a and second side wall 14b on the p-type silicon (Si) substrate 11. The extension region 19 prevents the depletion layer from spreading in the channel region, and prevents the below-described short channel effect from occurring between the deep source region 21a and the deep drain region 21b. The channel region of the n-type MIS transistor 10 refers to a region formed in the p-type silicon (Si) substrate 11 under the gate insulating layer 12, that is, in the protrusion 11a, during operation of the n-type MIS transistor 10.

The pocket regions 18 are formed so as to come in contact respectively with one edge and the opposite edge of the p-type silicon (Si) substrate 11 in the region where the gate insulating layer 12 is disposed and so as to cover the peripheries of the extension regions 19. The pocket regions 18 and the extensions region 19 are partially provided in the protrusion 11a of the p-type silicon (Si) substrate 11. The pocket region 18 is intended to suppress the punch through effect between the source region 25a and the drain region 25b. Preferably, the maximum depth of the pocket region 18 is, for example, 30 nm to 80 nm.

The deep source region 21a and the deep drain region 21b are formed with a predetermined interval so as to come in contact respectively with the ends of the p-type silicon (Si) substrate 11 in the regions under the first side walls 14a. Preferably, the maximum depth of the deep source region 21a and the deep drain region 21b is, for example, 50 nm to 200 nm.

The silicide layer 15 is formed on the surfaces of the gate electrode 13, the deep source region 21a and the deep drain region 21b. Preferably, the silicide layer 15 is formed to a thickness of, for example, 20 nm to 70 nm. It is not however necessary to provide the silicide layer 15 in the present embodiment.

The first side walls 14a are formed on the side surfaces of the gate electrode 13 and the side surface of the protrusion 11a, and on the p-type silicon (Si) substrate 11. The first side wall 14a may be made of silicon oxide ($SiO_2$), which is an insulating material having a lower Young's modulus than the p-type silicon (Si) substrate 11. Preferably, the silicon oxide ($SiO_2$) has an insulating strength of $10 \times 10^7$ (V/cm) or more. The first side walls 14a may be provided only on the side surface of the protrusion 11a.

The second side walls 14b are formed on the surfaces of the first side walls 14a. Preferably, the bottoms of the second side walls 14b are located lower than the upper surface of the protrusion 11a. The second side wall 14b is made of silicon nitride (SiN) having a higher Young's modulus than the p-type silicon (Si) substrate 11.

Preferably, the thickness of the second side wall 14b is about four times as large as the thickness of the first side wall 14a. In the first embodiment, the Young's modulus of silicon oxide ($SiO_2$) is 65 [GPa] while the Young's modulus of silicon nitride (SiN) is 200 to 300 [GPa]. Hence, the Young's modulus of silicon oxide ($SiO_2$) is about ¼ of the Young's modulus of silicon nitride (SiN). If the thickness of the silicon oxide ($SiO_2$) is reduced to ¼ of the thickness of the silicon nitride (SiN), the stress produced by the stress film 16a described later is absorbed by the deflection of the first side walls 14a. Consequently, the problem occurs that the stress produced by the stress film 16a is not efficiently transmitted to the channel region. The Young's modulus of silicon nitride (SiN) is varied depending on the forming conditions.

The stress film 16a is formed over the entire surface of the p-type silicon (Si) substrate 11 so as to cover the surfaces of the gate electrode 13, the first side walls 14a, the second side walls 14b, the silicide layer 15, the deep source region 21a and the deep drain region 21b. The stress film 16a has a thickness of, for example, about 70 nm to 90 nm.

Figure 4:
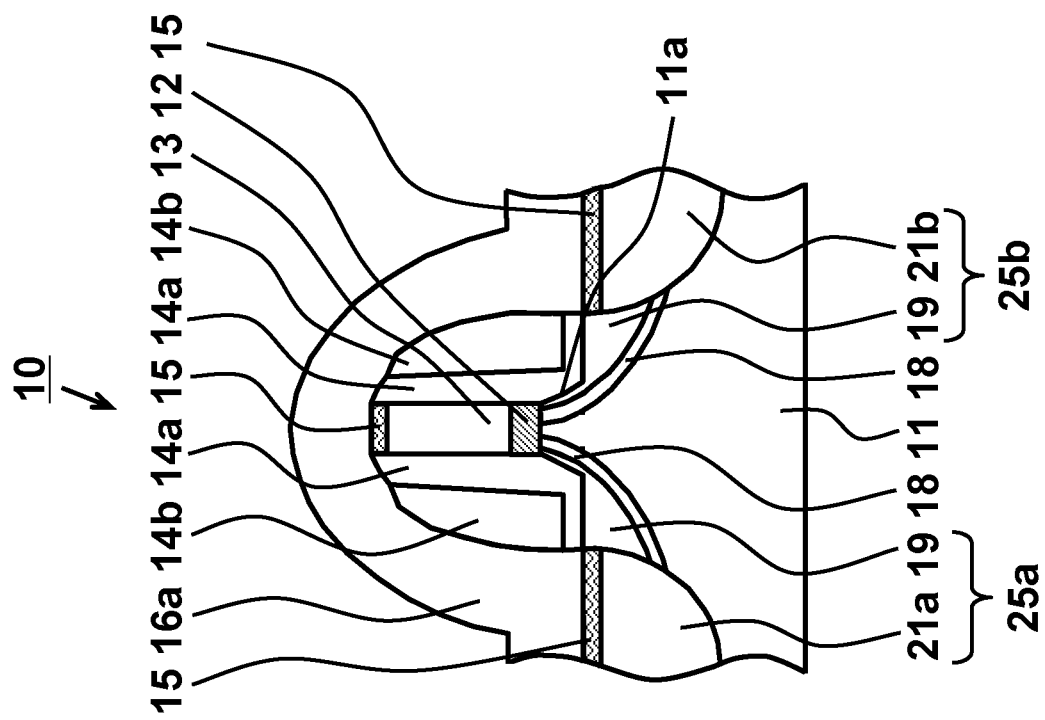
FIG. 4 is a representation of a sectional view illustrating the method of manufacturing the n-type transistor according to the first embodiment.

FIGS. 2 to 4 illustrate a method for manufacturing the n-type MIS transistor 10 according to the first embodiment.

FIG. 2A illustrates the process operation of forming the gate insulating layer 12 and the gate electrode 13.

The gate insulating layer 12 is formed on the p-type silicon (Si) substrate 11. For the gate insulating layer 12, a silicon oxynitride (SiON) layer is formed by CVD, or combination of thermal oxidation and thermal nitridation. The p-type silicon (Si) substrate 11 contains, for example, $1.0 \times 10^{16}$ cm$^{-3}$ of a p-type conductive impurity.

The gate electrode 13 is formed on the gate insulating layer 12. The gate electrode 13 is formed by depositing a polycrystalline silicon (Si) layer (not illustrated) to a thickness of about 100 nm on the gate insulating layer 12 by CVD or the like and patterning the polycrystalline silicon (Si) layer into an electrode shape by photolithography and anisotropic etching.

Figure 2B:
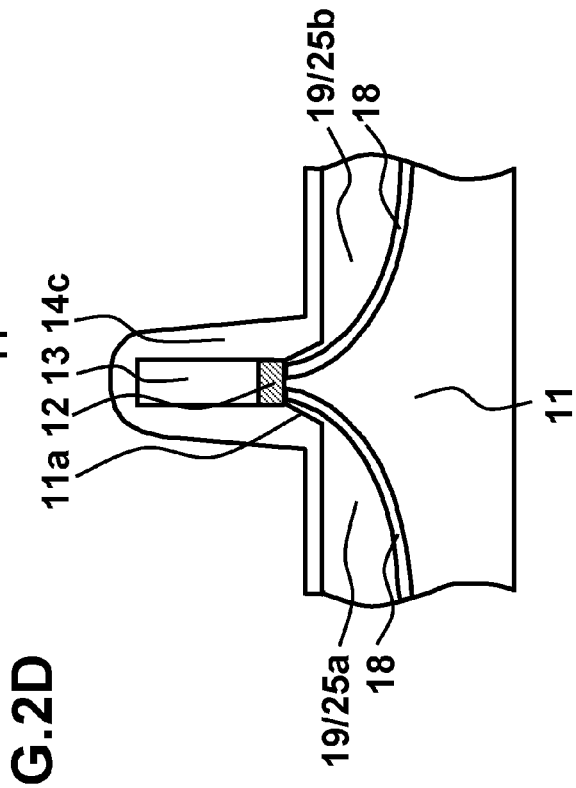

FIG. 2B illustrates the process operation of forming the pocket regions 18, the source region 25a and the drain region 25b. A first ion implantation is performed on the source region 25a and the drain region 25b.

A pair of pocket regions 18 is formed by oblique ion implantation of a p-type conductive impurity to the pocket regions 18 of the p-type silicon (Si) substrate 11, using the gate electrode 13 as a mask. Preferably, the oblique ion implantation is performed at an angle of 45° with the normal to the substrate, as indicated by arrows 18a. Boron (B) may be used as the p-type conductive impurity. The oblique ion implantation is performed under the conditions of an accelerated energy of 10 keV and a dose of $1 \times 10^{13}$/cm$^2$.

The extension regions 19 are part of the source region 25a and the drain region 25b. A pair of extension regions 19 is formed by the first ion implantation to the extension regions 19 of the p-type silicon (Si) substrate 11, using the gate electrode 13 as a mask. For example, arsenic (As) may be used as an n-type conductive impurity. The ion implantation is performed, for example, under the conditions of an accelerated energy of 5 keV and a dose of $1 \times 10^{14}$/cm$^2$.

Figure 2C:
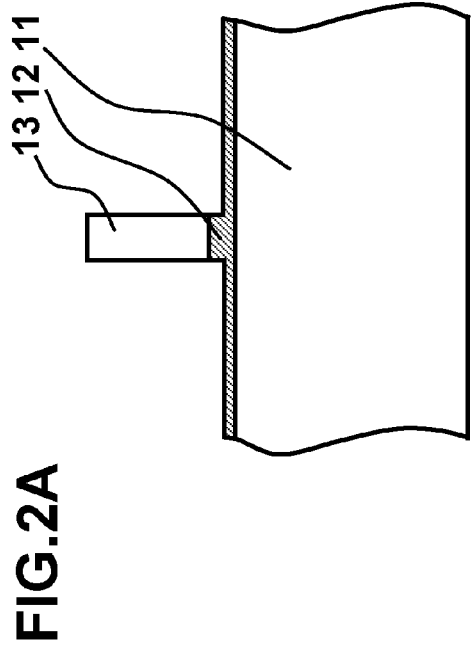

FIG. 2C illustrates the process operation of forming the protrusion 11a.

The protrusion 11a is formed with part of the gate insulating layer 12 and gate electrode 13 left on the p-type silicon (Si) substrate 11. The protrusion 11a is formed by anisotropically etching the silicon oxynitride (SiON) layer on the p-type silicon (Si) substrate 11 using the gate electrode 13 as a mask, and subsequently anisotropically etching the p-type silicon (Si) substrate 11 using the gate electrode 13 as a mask again. The silicon oxynitride (SiON) layer may be removed by etching in the operation illustrated in FIG. 2A. The anisotropic etching forming the protrusion 11a is performed under conditions where the side surface of the protrusion 11a may be tapered. For etching of the silicon oxynitride (SiON) layer and the p-type silicon (Si) substrate 11, for example, CHF$_3$/Ar/O$_2$ gas containing a fluorocarbon gas CHF$_3$ or CF$_4$/Ar/O$_2$ gas containing a fluorocarbon gas CF$_4$ is used.

Preferably, the inclination of the side surface of the protrusion 11a is 30 to 60 degrees. If the inclination of the protrusion 11a is less than 30 degrees, the extension regions 19 formed in the protrusion 11a are reduced. Consequently, the leakage current is increased in the channel region. If the inclination of the side surface of the protrusion 11a is larger than 60 degrees, the stress from the stress film 16a may not efficiently be transmitted to the protrusion 11a through the second side walls 14b. Consequently, it becomes difficult to increase the driving current of the n-type MIS transistor 10. The inclination of the side surface of the protrusion 11a is adjusted by varying the bias voltage and the concentration of the fluorocarbon gas used for the anisotropic etching.

The extension regions 19, which are part of the source region 25a and drain region 25b, are thus formed in the protrusion 11a of the p-type silicon (Si) substrate 11. The protrusion 11a has a height of about 10 nm to 20 nm. In this operation, the top of the polycrystalline silicon gate electrode 13 is also etched to reduce the height.

Figure 2D:
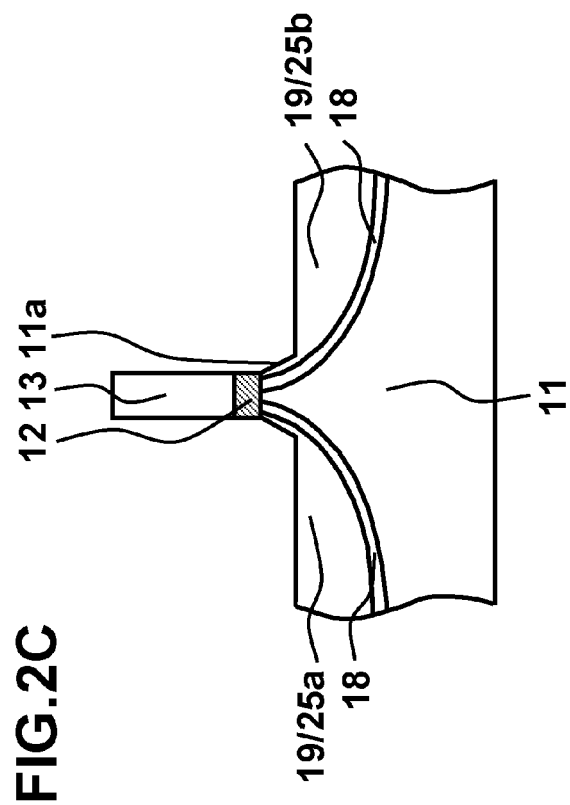

FIG. 2D illustrates the process operation of forming a silicon oxide (SiO$_2$) layer 14c intended for the first side walls 14a. The silicon oxide (SiO$_2$) layer 14c is a first insulating layer.

As illustrated in FIG. 2D, the insulating silicon oxide (SiO$_2$) layer 14c is formed to a thickness of about 5 nm to 10 nm by, for example, CVD so as to cover the side surface of the protrusion 11a and the gate electrode 13. Specifically, the silicon oxide (SiO$_2$) layer 14c may be formed by low pressure CVD reacting at a substrate temperature of 600° C. using, for example, tetraethoxysilane (TEOS) and O$_2$ as source gases. In this operation, the surface of the silicon oxide (SiO$_2$) layer 14c opposing the p-type silicon (Si) substrate 11 becomes lower than the upper surface of the protrusion 11a.

FIG. 3A illustrates the process operation of forming a silicon nitride (SiN) layer 14d intended for the second side walls 14b. The silicon nitride (SiN) layer 14d is a second insulating layer. As illustrated in FIG. 3A, the silicon nitride (SiN) layer 14d having a higher Young's modulus than the p-type silicon (Si) substrate 11 is formed to a thickness of 35 nm to 45 nm by, for example, CVD so as to cover the protrusion 11a, the gate electrode 13 and the silicon oxide (SiO$_2$) layer 14c. Specifically, the silicon nitride (SiN) layer 14d may be formed by low pressure CVD reacting at a substrate temperature of about 600° C. using dichlorosilane (SiCl$_2$H$_2$) and ammonia (NH$_3$) as source gases.

As an alternative to dichlorosilane (SiCl$_2$H$_2$), silane (SiH$_4$), bis(tert-butylamino silane) (BTBAS) or the like may be used as a silicon (Si) source gas for the silicon nitride (SiN) layer 14d.

FIG. 3B illustrates the process operation of forming the first side walls 14a and the second side walls 14b.

As illustrated in FIG. 3B, the first side walls 14a and the second side walls 14b are formed by anisotropically etching the silicon nitride (SiN) layer 14d and subsequently the silicon oxide (SiO$_2$) layer 14c over the entire surface of the p-type silicon (Si) substrate 11. For etching the silicon nitride (SiN) layer 14d, for example, CHF$_3$/Ar/O$_2$ gas containing a fluorocarbon gas CHF$_3$ may be used. For etching the silicon oxide (SiO$_2$) layer 14c, C$_4$F$_8$/Ar/O$_2$ gas containing a fluorocarbon gas C$_4$F$_8$ may be used.

The first side walls 14a are thus formed of an insulating material on the side surface of the protrusion 11a and on the p-type silicon (Si) substrate 11. The second side walls 14b are formed of a material having a higher Young's modulus than the silicon (Si) substrate on the surfaces of first side walls 14a.

In the present embodiment, the first side walls 14a and the second side walls 14b are formed by depositing the silicon oxide (SiO$_2$) layer 14c and the silicon nitride (SiN) layer 14d in that order, and then anisotropically etching the entire surface. Alternatively, the first side walls 14a may first be formed by depositing a silicon oxide (SiO$_2$) layer 14c and anisotropically etching the silicon oxide (SiO$_2$) layer 14c, and subsequently the second side walls 14b may be formed by depositing a silicon nitride (SiN) layer 14d and anisotropically etching the silicon nitride (SiN) layer 14d. This manufacturing method allows the first side walls 14a to be formed only on the side surfaces of the gate electrode 13 and the side surface of the protrusion 11a.

FIG. 3C illustrates the process operation of forming the deep source region 21a and the deep drain region 21b. A second ion implantation is performed on the deep source region 21a and the deep drain region 21b.

As illustrated in FIG. 3C, the deep source region 21a and the deep drain region 21b are formed by the second ion implantation of an n-type conductive impurity to the deep source region 21a and the deep drain region 21b on the p-type silicon (Si) substrate 11 using the gate electrode 13, the first side walls 14a and the second side walls 14b as a mask. For example, arsenic (As) may be used as an n-type conductive impurity. The ion implantation is performed, for example, under the conditions of an accelerated energy of 30 keV and a dose of $1 \times 10^{15}/cm^2$.

Then, the ion-implanted impurity may be activated by annealing at 1000° C. for about 10 seconds.

FIG. 3D illustrates the process operation of forming the silicide layer 15.

As illustrated in FIG. 3D, a metal for forming the silicide layer 15 is deposited on the surfaces of the gate electrode 13, the deep source region 21a and the deep drain region 21b. In the present embodiment, the metal for forming the silicide is, for example, cobalt (Co). The deposition of cobalt (Co) on the surfaces of the gate electrode 13, the deep source region 21a and the deep drain region 21b is performed by sputtering using, for example, a cobalt (Co) target with a DC bias of about 250 W applied. Preferably, cobalt (Co) is deposited to a thickness of, for example, about 3 nm to 8 nm. The primary siliciding reaction of cobalt (Co) at the surfaces of the gate electrode 13, the deep source region 21a and the deep drain region 21b may be performed by low-temperature annealing, for example, at about 500° C. for 30 seconds in a nitrogen ($N_2$) atmosphere. Then, the unreacted cobalt (Co) layer is removed with, for example, a mixture of ammonium hydrogen peroxide ($NH_3.H_2O_2$) and persulfuric acid ($H_2SO_5$). Subsequently, a secondary siliciding at the surfaces of the gate electrode 13 and the p-type silicon (Si) substrate 11 may be performed by high-temperature annealing at, for example, about 700° C. for about 30 seconds in a nitrogen (N2) atmosphere. The silicide layer 15 is thus formed on the surfaces of the gate electrode 13, the deep source region 21a and the deep drain region 21b. The metal for forming the silicide layer 15 may be nickel (Ni).

FIG. 4 illustrates the process operation of forming the stress film 16a.

The stress film 16a is formed over the gate electrode 13, the first side walls 14a and the second side wall 14b. Specifically, the stress film 16a is formed over the entire surface of the p-type silicon (Si) substrate 11 so as to cover the surfaces of the gate electrode 13, the first side walls 14a, the second side walls 14b, the silicide layer 15, the deep source region 21a and the deep drain region 21b. Preferably, the stress film 16a is made of, for example, silicon nitride (SiN). Preferably, the stress film 16a is formed by, for example, plasma CVD. The stress film 16a is formed to a thickness of, for example, about 70 nm to 90 nm. For forming the silicon nitride (SiN) layer intended for the stress film 16a, a SiN forming gas (for example, $NH_3$ and $SiH_4$) is used. Then, hydrogen (H) is removed from the silicon nitride (SiN) layer being the stress film 16a by UV curing. Thus, the stress film 16a may be formed so that the silicon nitride (SiN) layer shrinks and exhibits the property of applying a tensile stress to the channel region.

The n-type MIS transistor 10 is thus completed through further operations including the operations of forming an insulating interlayer (not illustrated), forming a contact hole (not illustrated) using the stress film 16a as an etching stopper, and forming conductor lines (not illustrated).

The above embodiment has described a MIS transistor using an n-type MIS transistor 10. The MIS transistor, however, may be a p-type MIS transistor. In such a case, the conductivity type of the above n-type MIS transistor 10 is reversed for a p-type MIS transistor.

The present embodiment is not limited to the structure, conditions and the like described in the present embodiment. Various modifications may be made in the embodiment.

Figure 5:
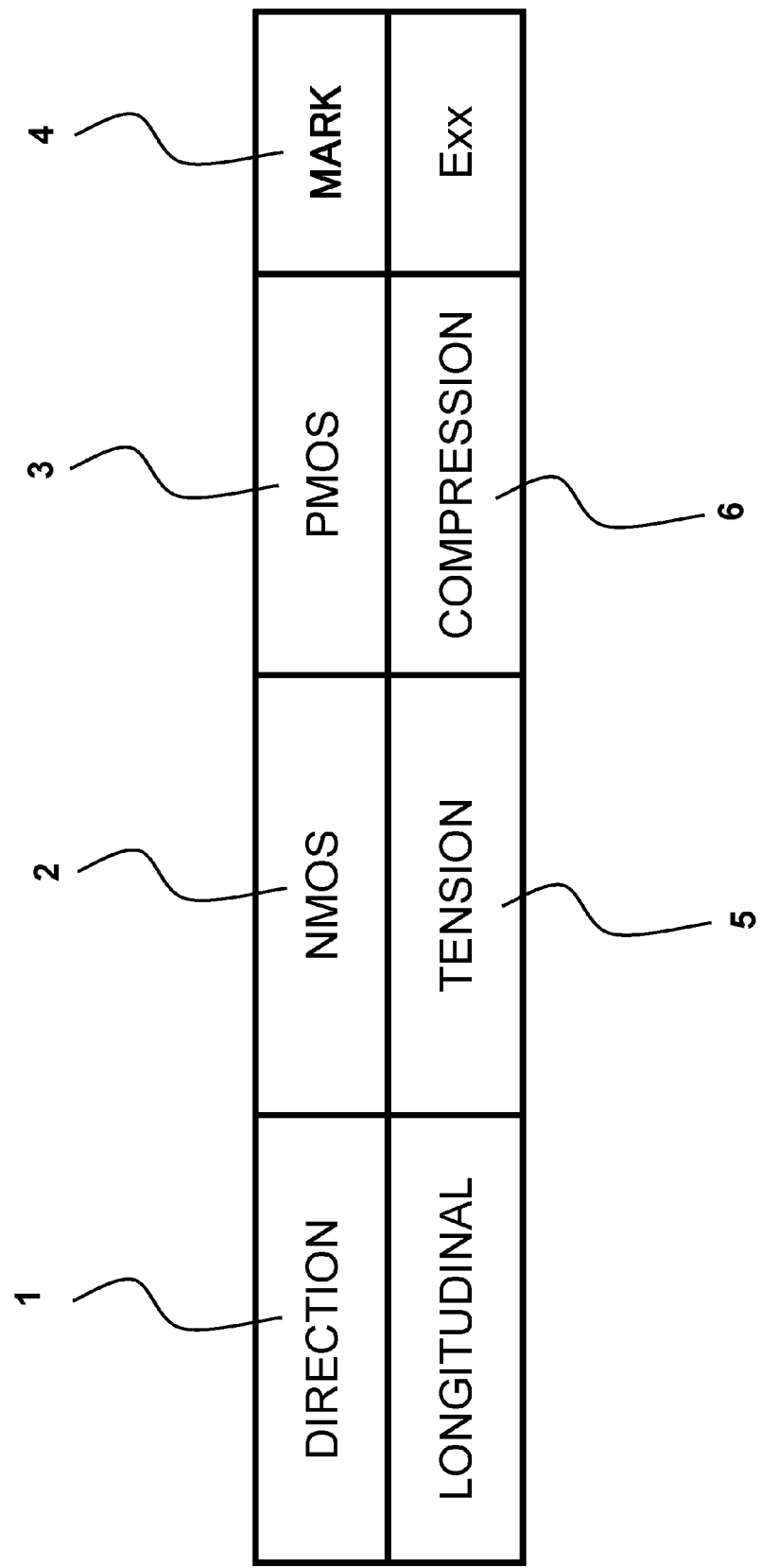
FIG. 5 is a table illustrating the orientation of the stress and distortion applied to the channel region of an n-type MIS transistor for optimally increasing the driving current of the n-type MIS transistor, and the orientation of the stress and distortion applied to the channel region of a p-type MIS transistor for optimally increasing the driving current of the p-type MISFET.

FIG. 5 is a table illustrating the orientation of the stress and distortion applied to the channel region of an n-type MIS transistor, suitable to increase the driving current of the n-type MIS transistor, and the orientation of the stress and distortion applied to the channel region of a p-type MIS transistor, suitable to increase the driving current of the p-type MIS transistor.

In FIG. 5, the Direction column is denoted by 1; the NMOS field, by 2; the PMOS field, by 3, the mark column, by 4; the Tension field, by 5; and the Compression field, by 6.

The Direction column 1 is filled with the direction of the stress and distortion produced by a stress. The stress and distortion are produced in the longitudinal direction (X direction: direction connecting the source region and the drain region).

The NMOS column 2 is filled with the orientation of the stress applying a distortion suitable to increase the driving current of an n-type MIS transistor.

It is illustrated that tension is suitable for the distortion in the longitudinal direction.

The Tension 5 represents that when a distortion is applied by a tensile force in the longitudinal direction (X direction: direction connecting the source region and the drain region), the driving current is increased.

The PMOS column 3 is filled with the orientation of the stress applying a distortion suitable to increase the driving current of a p-type MIS transistor.

The orientation of the longitudinal direction is compression 6. This means that a distortion produced by compression is suitable to increase the driving current.

In the present embodiment, it is a necessary condition for increasing the driving current of the MIS transistor that the longitudinal direction (X direction: direction connecting the source region and the drain region) coincides with the <110> direction of the silicon (Si) semiconductor substrate.

The band structure of a silicon (Si) crystal is changed by applying a distortion, thereby increasing the effective mobility of conductive carriers in the inversion layer of a MIS transistor. By increasing the effective mobility of the conductive carriers, the driving current of the MIS transistor is increased. In contrast, if the distortion is applied to the band structure in a reverse direction, the effective mobility of the conductive carriers is reduced.

For the orientations of stress applying distortion suitable to increase the driving current of a MIS transistor, illustrated in the NMOS column 2 and the PMOS column 3, a non-patent document: S. E. Thompson et al., *IEEE Trans. Elec. Dev*, pp. 1790-1797, November 2004 was consulted.

The mark column 4 illustrates that the distortion in the longitudinal direction (X direction: direction connecting the source region and the drain region) is represented by Exx.

FIG. 5 illustrates that Exx in the orientation of tension 5 illustrated in the NMOS column 2 contributes to the carrier mobility in the channel region. Also, it is illustrated that Exx in the orientation of compression illustrated in the PMOS column 3 contributes to the carrier mobility in the channel region.

FIG. 6 is a representation illustrating the improvement of the stress and distortion in the channel region of the n-type MIS transistor 10 according to the first embodiment.

Figure 6A:
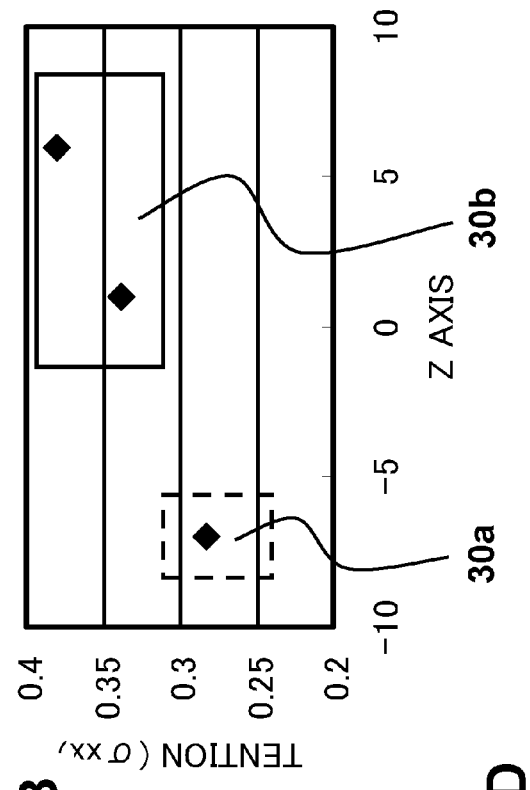
FIG. 6A-6D are representations illustrating the improvement of the stress and distortion in the n-type MIS transistor according to the first embodiment.

FIG. 6A illustrates an n-type MIS transistor 10'. Arrows 22a in the figure indicate the orientation of the stress σxx and distortion Exx produced in the X direction (direction connecting the source region and the drain region) in the channel region. The orientation in which distortion Exx is produced corresponds to that of distortion Exx illustrated in FIG. 5. The gate electrode 13 has a width of 40 nm and a height of 100 nm. The first side wall 14a has a width of 10 nm, and the second side wall 14b has a width of 30 nm. The stress film 16a over the n-type MIS transistor 10' has a thickness of 80 nm. The stress film 16a is a film applying a tensile stress, that is, a silicon nitride (SiN) film having a tensile stress.

Figure 6B:
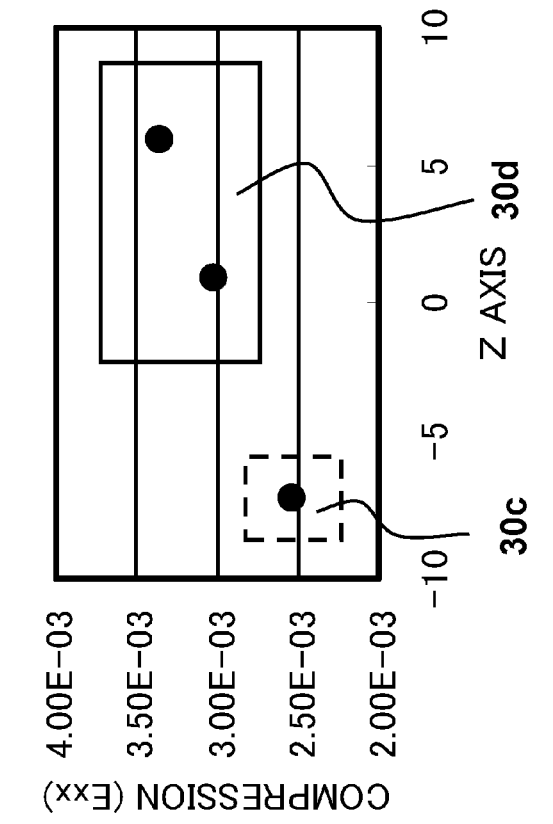

FIG. 6B illustrates an n-type MIS transistor 10. Arrows 22b in the figure indicate the orientation of the stress σxx and distortion Exx produced in the X direction (direction connecting the source region and the drain region) in the channel region. The orientation in which distortion Exx is produced corresponds to that of distortion Exx illustrated in FIG. 5. The difference between the n-type MIS transistor 10' illustrated in FIG. 6A and the n-type MIS transistor 10 illustrated in FIG. 6B is that the n-type MIS transistor 10 has a protrusion 11a of 15 nm in height.

Figure 6C:
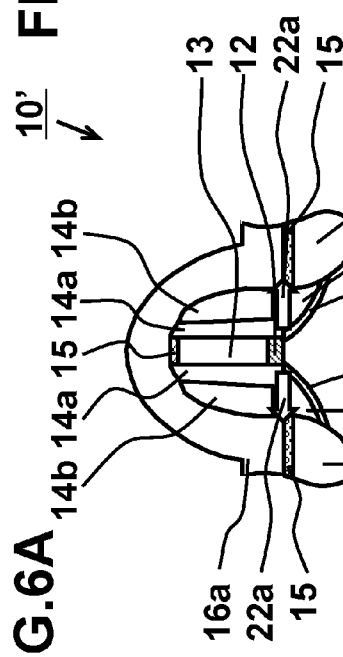

FIG. 6C illustrates the results of simulations for stress σxx and distortion Exx produced in the vicinity of the channel region in the structures of the n-type MIS transistor 10' and the n-type MIS transistor 10. In FIG. 6C, the vertical axis represents the stress σxx in the X direction. The distortion Exx is obtained by dividing the length of elongation by the original length, and is dimensionless. The lateral axis of FIG. 6C represents the position in the range of −10 nm to 10 nm, wherein the interface between the p-type silicon (Si) substrate 11 and the gate insulating layer 12 is defined as the origin point, and the lower side from the gate insulating layer 12 is positive and the height direction of the gate electrode 13 is negative.

In the simulations for obtaining the above-described stress and distortion, the Young's moduli of the silicon oxide (SiO$_2$) of the first side wall 14a, the silicon (Si) of the p-type silicon (Si) substrate 11, the silicon nitride (SiN) of the second side wall 14b are set so as to be increased in that order. Specifically, the Young's modulus of silicon oxide (SiO$_2$) is set at 65 [GPa]; the Young's modulus of silicon (Si) is set at 130 GPa; and the Young's modulus of silicon nitride (SiN) is set at 200 GPa.

In FIG. 6C, the black rhombic data 30a surrounded by a dashed line represents a value of stress σxx in the n-type MIS transistor 10', and the black rhombic data 30b surrounded by a solid line represent values of stress σxx in the n-type MIS transistor 10. In this figure, the black rhombic data 30a surrounded by the dashed line represents a value of stress σxx along the z axis at the interface between the p-type silicon (Si) substrate 11 and the gate insulating layer 12. The black rhombic data 30b surrounded by the solid line represent values of stresses σxx at positions respectively 1 nm and 6 nm lower than the origin point of the interface between the p-type silicon (Si) substrate 11 and the gate insulating layer 12.

FIG. 6C compares the black rhombic data 30a surrounded by the dashed line and the black rhombic data 30b surrounded by the solid line. In the black rhombic data 30a surrounded by the dashed line, the stress σxx in the n-type MIS transistor 10' at the interfaced between the p-type silicon (Si) substrate 11 and the gate insulating layer 12 was 0.28. In the black rhombic data 30b surrounded by the solid line, the stresses σxx in the n-type MIS transistor 10 were 0.34 and 0.38 respectively.

Figure 6D:
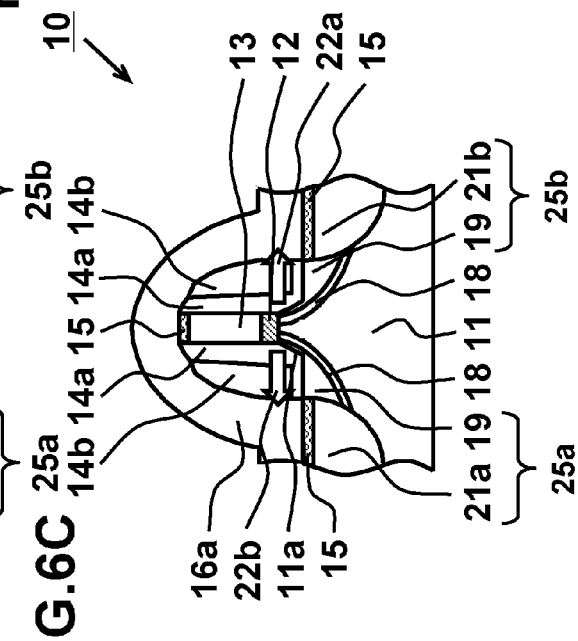

FIG. 6D is a graph illustrating distortions, or σxx, in the longitudinal direction (X direction: direction connecting the source region and the drain region) obtained by simulations using the n-type MIS transistor 10' and the n-type MIS transistor 10. In FIG. 6D, the black circular data 30c surrounded by a dashed line represents the distortion Exx in the n-type MIS transistor 10', and the black circular data 30d surrounded by a solid line represent the distortion Exx in the n-type MIS transistor 10. In this figure, the black circular data 30c surrounded by the dashed line represents the value of distortion Exx along the z axis at the interface between the p-type silicon (Si) substrate 11 and the gate insulating layer 12. The black circular data 30d surrounded by the solid line represent the values of distortions Exx at positions respectively 1 nm and 6 nm lower than the origin point of the interface between the p-type silicon (Si) substrate 11 and the gate insulating layer 12.

FIG. 6D compares the black circular data 30c surrounded by the dashed line and the black circular data 30d surrounded by the solid line. While the distortion Exx of the black circular data 30c surrounded by the dashed line is 0.0025 at the interface between the p-type silicon (Si) substrate 11 and the gate insulating layer 12 in the n-type MIS transistor 10', the distortions Exx of the black circular data 30d surrounded by the solid line are 0.0030 and 0.0034 respectively in the n-type MIS transistor 10.

FIGS. 6C and 6D illustrate that the positive stress σxx (uniaxial stress) and distortion Exx in the X direction (direction connecting the source region and the drain region) in the n-type MIS transistor 10 are higher than those in the n-type MIS transistor 10'.

The stress σxx and distortion Exx pulling the channel region in the X direction are produced in the channel region through the second side walls 14b when the stress film 16a shrinks in the manufacturing process of the n-type MIS transistor 10. It may be thought that since the n-type MIS transistor 10 includes the second side walls 14b of silicon nitride (SiN) at both ends of the channel region, the uniaxial stress and distortion in the X direction produced in the channel region are more increased than those in the n-type MIS transistor 10'. Since the distortion Exx contributes to the increase of the carrier mobility in the channel region, as illustrated in FIG. 5, the carrier mobility in the channel region of the n-type MIS transistor 10 may be increased.

In the MIS transistor and the method of manufacturing the MIS transistor, according to the first embodiment, a second side wall having a higher Young's modulus than the silicon (Si) substrate is formed at both ends of the channel region. By forming the second side wall at both ends of the channel region, the uniaxial stress in the channel region may be increased.

In the MIS transistor and the method of manufacturing the MIS transistor, according to the present embodiment, the first side wall is formed of silicon oxide (SiO$_2$), which is an insulating material. Since the first side wall is made of silicon oxide (SiO$_2$), the withstand voltage between the gate electrode and the source region and between the gate electrode and the drain region may be kept high.

FIGS. 7 to 11 are representations of the structure of an n-type MIS transistor 20 according to a second embodiment and a method of manufacturing the n-type MIS transistor 20. In the MIS transistor 20 and the method of manufacturing the MIS transistor 20, according to the second embodiment, the protrusion 11b of the MIS transistor 20 has a lower height than that of the MIS transistor 10 of the first embodiment. In addition, the first insulating layer 14c is formed lower than the height of the protrusion 11b by anisotropic etching. By reducing the height of the protrusion 11b, the extension regions 19 of the protrusion 11b may be increased. Since the extension regions 19 may be increased, the leakage current in the channel region may be reduced.

Figure 7A:
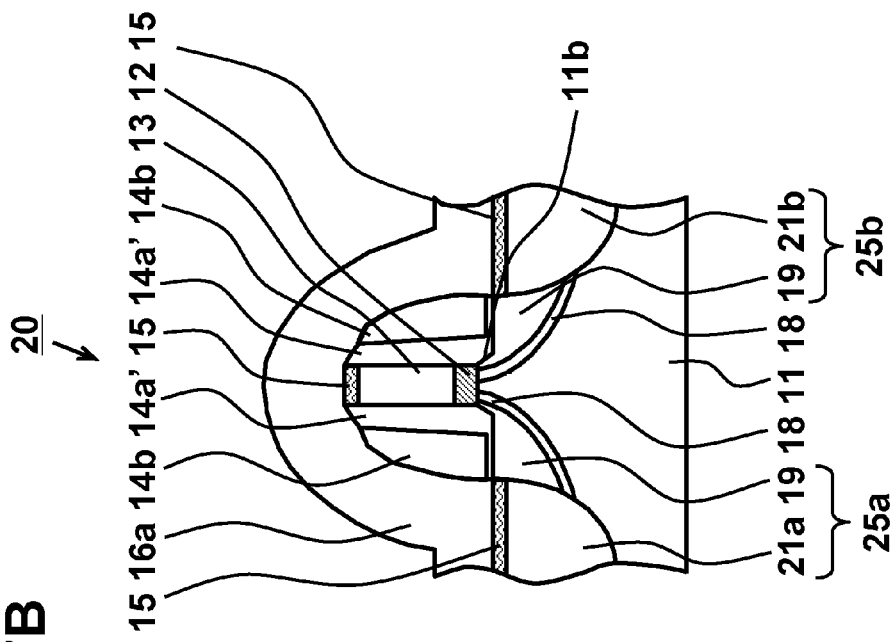
FIGS. 7A and 7B are representations illustrating the structure of an n-type MIS transistor according to a second embodiment.
Figure 7B:
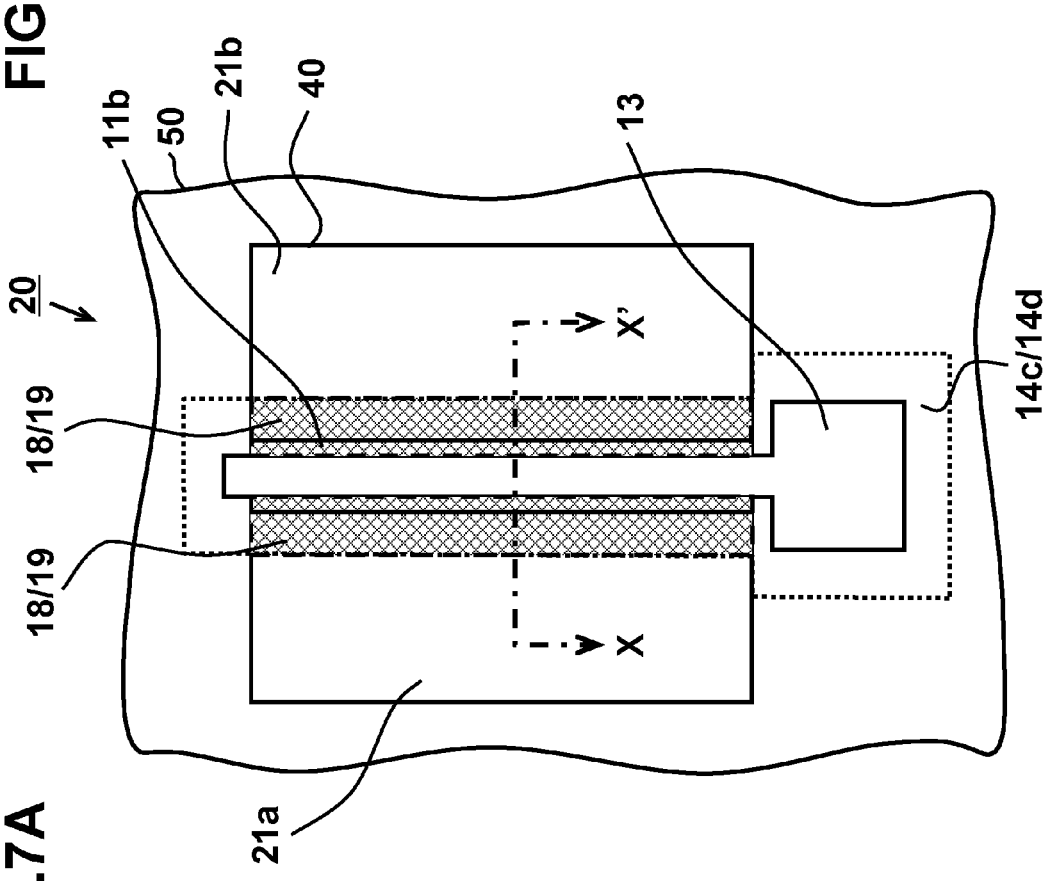

FIG. 7 illustrates the structure of the n-type MIS transistor 20 according to the second embodiment. FIG. 7A is a plan view of the n-type MIS transistor 20. FIG. 7B is a sectional view taken along line X-X' in FIG. 7A. In FIG. 7, the same members as in the first embodiment are designated by the same reference numerals and the same description of these members will be omitted.

In FIG. 7A, reference numeral 11b denotes the protrusion; 13 denotes a gate electrode; 14a denotes a first side wall; 14b denotes a second side wall; 18 denotes a pocket region; 19 denotes an extension region; 21a denotes a deep source region; 21b denotes a deep drain region; 40 denotes an active region; and 50 denotes an element isolation region. The n-type MIS transistor 20 is an example of the semiconductor device.

As illustrated in FIG. 7A, the element isolation region 50 is formed around the n-type MIS transistor 20. The active region 40 is a rectangular region defined by the element isolation region 50. The gate electrode 13 extends across the center of the active region 40. The first side wall 14a and the second side wall 14b are formed around the gate electrode 13. The pocket regions 18 and the extension regions 19 are formed to predetermined widths along the gate electrode 13 in the active region 40. The gate electrode 13 is formed over the protrusion 11b. The deep source region 21a and the deep drain region 21b are formed in the entire active region 40 except the gate electrode 13, the pocket regions 18 and the extension regions 19.

In FIG. 7B, reference numeral 11 denotes a p-type silicon (Si) substrate; 11b denotes the protrusion; 12 denotes a gate insulating layer; 13 denotes the gate electrode; 14a denotes the first side wall; 14b denotes the second side wall; 15 denotes a silicide layer; 16a denotes a stress film; 18 denotes the pocket region; 19 denotes the extension region; 21a denotes the deep source region; and 21b denotes the deep drain region. In FIG. 7B, the same parts as those in FIG. 7A are designated by the same reference numerals.

The protrusion 11b is formed on the p-type silicon (Si) substrate 11. Preferably, the side surface of the protrusion 11b is tapered. The protrusion 11b has a height of 6 nm to 10 nm.

The gate insulating layer 12 is formed on the protrusion 11b of the p-type silicon (Si) substrate 11. The gate insulating layer 12 has a thickness of, for example, about 1 nm to 2 nm.

The gate electrode 13 is formed to a height of, for example, about 100 nm on the gate insulating layer 12. Polysilicon (Si) may be used for the gate electrode 13.

The source region 25a and the drain region 25b are provided in the protrusion 11b of the p-type silicon (Si) substrate 11. The extension regions 19 are part of the source region 25a and the drain region 25b. Preferably, the extension regions 19 are formed to a width of, for example, 40 nm to 60 nm respectively from one edge and the opposite edge of the p-type silicon (Si) substrate 11 in the region where the gate insulating layer 12 is disposed, and to a depth of at most 20 nm to 60 nm from the surface of the p-type silicon (Si) substrate 11.

The pocket regions 18 are formed so as to come in contact respectively with one edge and the opposite edge of the p-type silicon (Si) substrate 11 in the region where the gate insulating layer 12 is disposed and so as to cover the peripheries of the extension regions 19. The pocket regions 18 and the extensions region 19 are partially provided in the protrusion 11b of the p-type silicon (Si) substrate 11. Preferably, the maximum depth of the pocket region 18 is, for example, 30 nm to 80 nm.

The deep source region 21a and the deep drain region 21b are formed with a predetermined interval so as to come in contact respectively with the ends of the p-type silicon (Si) substrate 11 in the regions under the first side walls 14a'. Preferably, the maximum depth of the deep source region 21a and the deep drain region 21b is, for example, 50 nm to 200 nm.

The silicide layer 15 is formed on the surfaces of the gate electrode 13, the deep source region 21a and the deep drain region 21b. Preferably, the silicide layer 15 is formed to a thickness of, for example, 20 nm to 70 nm. It is not however necessary to provide the silicide layer 15 in the present embodiment.

The first side walls 14a' are formed on the side surfaces of the gate electrode 13 and the side surface of the protrusion 11b, and on the p-type silicon (Si) substrate 11. The first side wall 14a' may be made of silicon oxide ($SiO_2$), which is an insulating material having a lower Young's modulus than the p-type silicon (Si) substrate 11. The thickness of the first side walls 14a' from the surface of the p-type silicon (Si) substrate 11 other than the protrusion 11b is 3 nm or less.

The second side walls 14b are formed on the surfaces of the first side walls 14a'. Preferably, the bottoms of the second side walls 14b are located lower than the upper surface of the protrusion 11b. The second side wall 14b may be made of silicon nitride (SiN) having a higher Young's modulus than the p-type silicon (Si) substrate 11. The first side wall in the present embodiment corresponds to the first side wall 14a in the first embodiment. Accordingly, it is preferable that the thickness of the second side wall 14b is about four times as large as the thickness of the first side wall 14a'.

The stress film 16a is formed over the entire surface of the p-type silicon (Si) substrate 11 so as to cover the surfaces of the gate electrode 13, the first side walls 14a', the second side walls 14b, the silicide layer 15, the deep source region 21a and the deep drain region 21b. The stress film 16a has a thickness of, for example, about 70 nm to 90 nm.

FIGS. 8 to 10 illustrate a method for manufacturing the n-type MIS transistor 20 according to the second embodiment. In FIGS. 8 to 10, the same members as those described in FIGS. 2 to 4 in the first embodiment are designated by the same reference numerals and the same description of these members will be omitted.

FIG. 8A illustrates the process operation of forming the gate insulating layer 12 and the gate electrode 13 in the same manner as the technique illustrated in FIG. 2A in the first embodiment.

FIG. 8B illustrates the process operation of forming the pocket regions 18, the source region 25a and the drain region 25b. A first ion implantation is performed on the source region 25a and the drain region 25b.

The pair of pocket regions 18 is formed in the same manner as the technique illustrated in FIG. 2B in the first embodiment.

The extension regions 19 are part of the source region 25a and the drain region 25b. The pair of extension regions 19 is formed by the first ion implantation to the extension regions 19 of the p-type silicon (Si) substrate 11, using the gate electrode 13 as a mask. For example, arsenic (As) may be used as an n-type conductive impurity. The first ion implantation is performed, for example, under conditions of an accelerated energy of 5 keV and a dose of $1 \times 10^{14}/cm^2$.

FIG. 8C illustrates the process operation of forming the protrusion 11b.

The protrusion 11b is formed with part of the gate insulating layer 12 and gate electrode 13 left on the p-type silicon (Si) substrate 11. The protrusion 11b is formed by anisotropically etching the silicon oxynitride (SiON) layer on the p-type silicon (Si) substrate 11 using the gate electrode 13 as a mask, and subsequently performing anisotropic etching using the gate electrode 13 as a mask again. The anisotropic etching forming the protrusion 11b is performed under conditions where the side surface of the protrusion 11a may be tapered. For etching of the silicon oxynitride (SiON) layer and the p-type silicon (Si) substrate 11, for example, $CHF_3$/Ar/$O_2$ gas containing a fluorocarbon gas $CHF_3$ or $CF_4$/Ar/$O_2$ gas containing a fluorocarbon gas $CF_4$ is used. Preferably, the inclination of the tapered surface of the protrusion 11b is 30 to 60 degrees.

The extension regions 19, which are part of the source region 25a and drain region 25b, are thus formed in the protrusion 11b of the p-type silicon (Si) substrate 11. The protrusion 11b has a height of about 6 nm to 10 nm. In this operation, the top of the polycrystalline silicon gate electrode 13 is also etched to reduce the height.

The MIS transistor 20 of the present embodiment has a lower protrusion 11b than the MIS transistor 10 of the first embodiment. By reducing the height of the protrusion 11b, the extension regions 19 of the protrusion 11b may be more increased than those in the MIS transistor 10 of the first embodiment. Since the extension regions 19 of the protrusion 11b may be formed larger, the leakage current in the channel region may be reduced.

FIG. 8D illustrates the process operation of forming a silicon oxide ($SiO_2$) layer 14c intended for the first side walls 14a' in the same manner as the technique illustrated in FIG. 2D in the first embodiment. The silicon oxide ($SiO_2$) layer 14c is a first insulating layer.

Figure 9A:
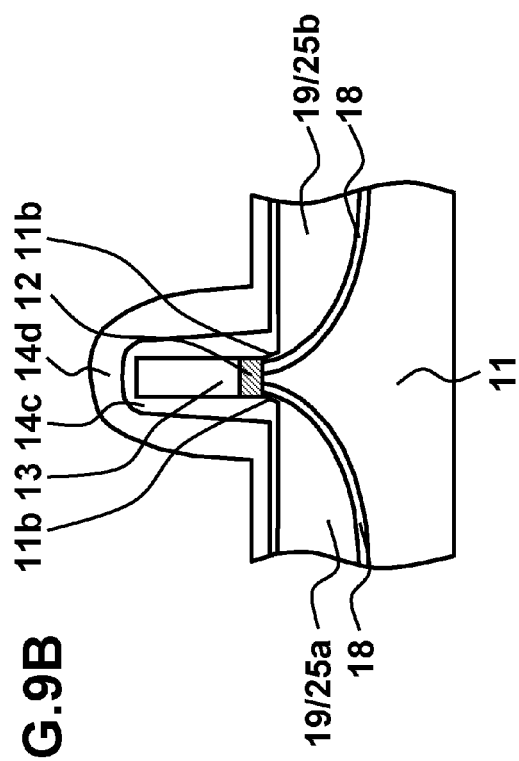
FIGS. 9A-9D are representations of sectional views illustrating the method of manufacturing the n-type transistor according to the second embodiment.

FIG. 9A illustrates the process operation of anisotropically etching the silicon oxide ($SiO_2$) layer 14c.

As illustrated in FIG. 9A, the operation of anisotropically etching the silicon oxide ($SiO_2$) layer 14c is intended to reduce the thickness of the silicon oxide ($SiO_2$) layer 14c to a level lower than the upper surface of the protrusion 11b of the p-type silicon (Si) substrate 11. Preferably, the thickness of silicon oxide ($SiO_2$) layer 14c on the surface of the p-type silicon (Si) substrate 11 is 3 nm or less. The anisotropic etching of the silicon oxide ($SiO_2$) layer 14c is performed by RIE. The anisotropic etching of the silicon oxide ($SiO_2$) layer 14c uses $C_4F_8$/Ar/$O_2$ gas containing a fluorocarbon gas $C_4F_8$.

Figure 9B:
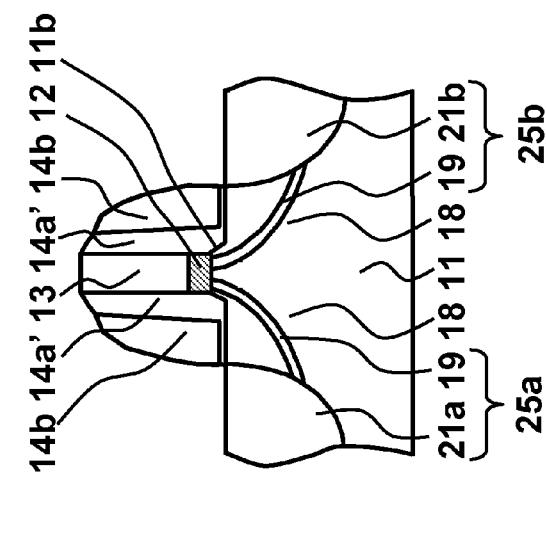

FIG. 9B illustrates the process operation of forming a silicon nitride (SiN) layer 14d intended for the second side walls 14b in the same manner as the technique illustrated in FIG. 3A in the first embodiment. The silicon nitride (SiN) layer 14d is a second insulating layer.

Figure 9C:
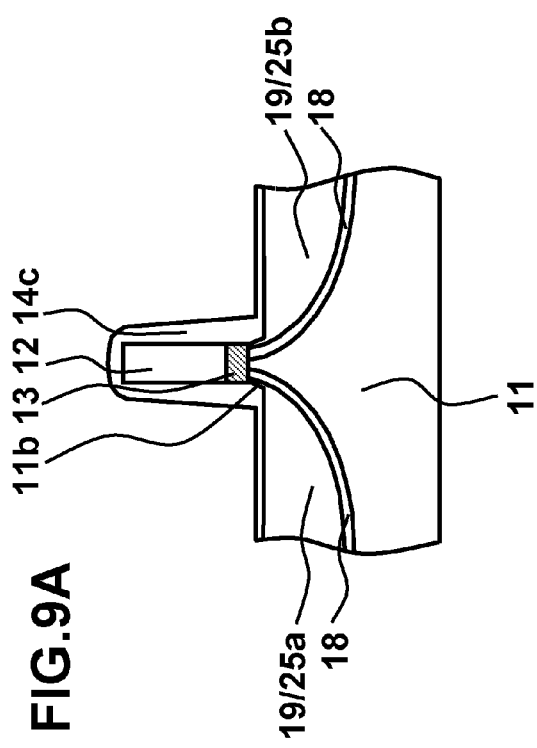

FIG. 9C illustrates the process operation of forming the first side walls 14a' and the second side walls 14b in the same manner as the technique illustrated in FIG. 3B in the first embodiment. The first side walls 14a' are thus formed of an insulating material on the side surface of the protrusion 11b and on the p-type silicon (Si) substrate 11. The second side walls 14b are formed of a material having a higher Young's modulus than the silicon (Si) substrate on the surfaces of first side walls 14a'.

Figure 9D:
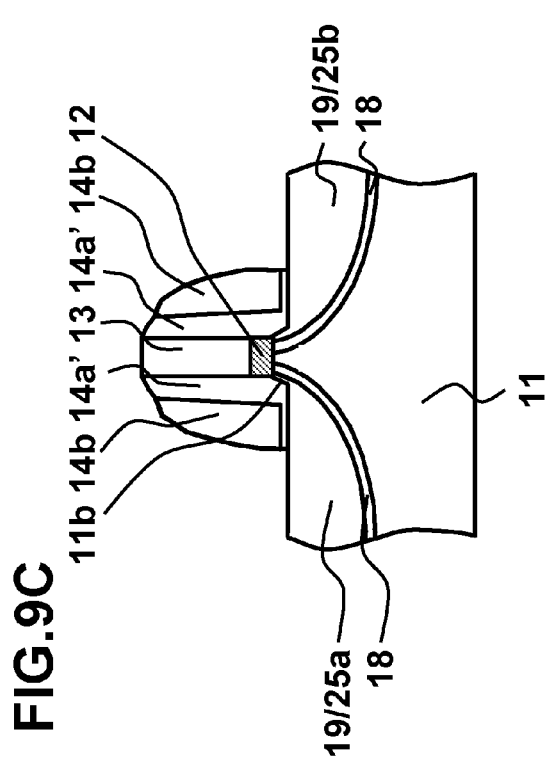

FIG. 9D illustrates the process operation of forming the deep source region 21a and the deep drain region 21b in the same manner as the technique illustrated in FIG. 3C in the first embodiment. A second ion implantation is performed on the deep source region 21a and the deep drain region 21b.

Then, the ion-implanted impurity may be activated by annealing at 1000° C. for about 10 seconds.

Figure 10B:
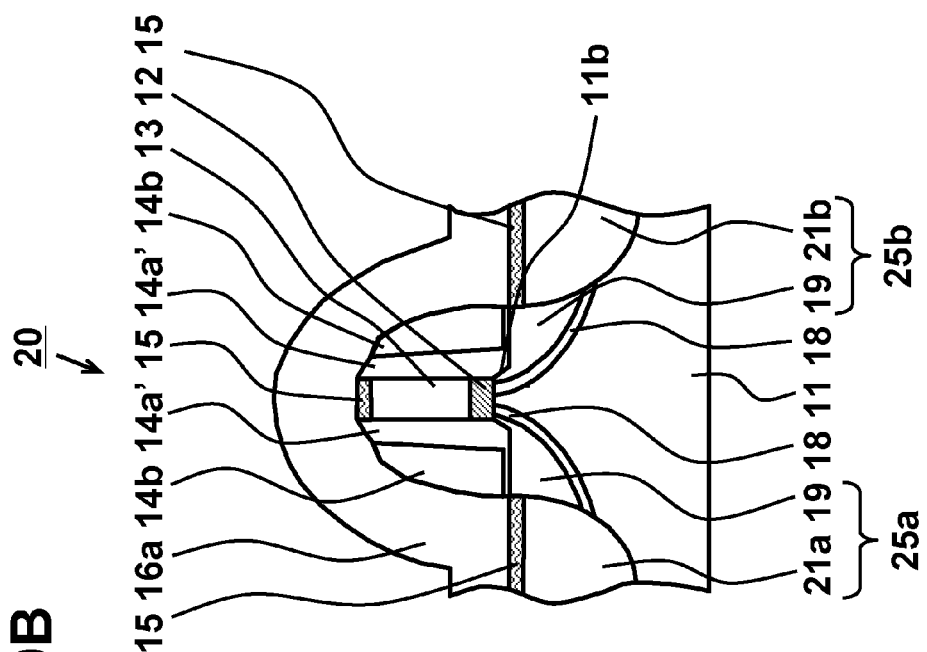
FIGS. 10A and 10B are representations of sectional views illustrating the method of manufacturing the n-type transistor according to the second embodiment.
Figure 10A:
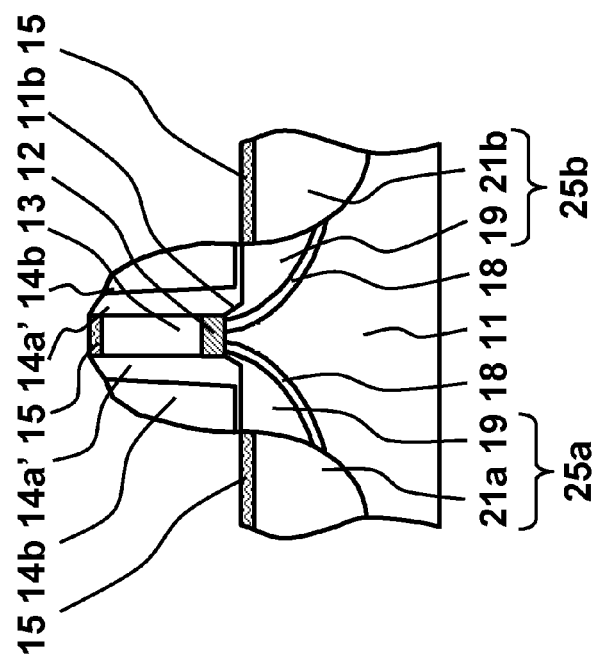

FIG. 10A illustrates the process operation of forming a silicide layer 15 in the same manner as the technique illustrated in FIG. 3D in the first embodiment.

FIG. 10B illustrates the process operation of forming a stress film 16 in the same manner as the technique illustrated in FIG. 4A in the first embodiment.

The n-type MIS transistor 20 is thus completed through further operations including the operations of forming an insulating interlayer (not illustrated), forming a contact hole (not illustrated) using the stress film 16a as an etching stopper, and forming conductor lines (not illustrated).

The above embodiment has described a MIS transistor using an n-type MIS transistor 20. The MIS transistor, however, may be a p-type MIS transistor. In such a case, the conductivity type of the above n-type MIS transistor 20 is reversed for a p-type MIS transistor.

The embodiment is not limited to the structure, conditions and the like described in the present embodiment. Various modifications may be made in the embodiment.

FIG. 11 is a representation illustrating the improvement of the stress and distortion in the channel region of the n-type MIS transistor 20 according to the second embodiment.

FIG. 11A illustrates again the n-type MIS transistor 10' illustrated in FIG. 6A in the first embodiment. Arrows 22a in the figure indicate the orientation of the stress σxx and distortion Exx produced in the X direction (direction connecting the source region and the drain region) in the channel region.

FIG. 11B illustrates an n-type MIS transistor 20. Arrows 22c in the figure indicate the orientation of the stress σxx and distortion Exx produced in the X direction (direction connecting the source region and the drain region) in the channel region. The orientation in which distortion Exx is produced corresponds to that of distortion Exx illustrated in FIG. 5. The difference between the n-type MIS transistor 10' illustrated in FIG. 11A and the n-type MIS transistor 20 illustrated in FIG. 11B is that the n-type MIS transistor 20 has the protrusion 11b of 8 nm in height, and that the thickness of the first side walls 14a' on the surface of the p-type silicon (Si) substrate 11 is 3 nm or less.

FIG. 11C illustrates the results of simulations for stress σxx and distortion Exx produced in the vicinity of the channel region in the structures of the n-type MIS transistor 10' and the n-type MIS transistor 20. In FIG. 11C, the vertical axis represents the stress σxx in the X direction. The stress σxx is obtained by dividing the length of elongation by the original length, and is dimensionless. The lateral axis of FIG. 11C represents the position in the range of −10 nm to 10 nm, wherein the interface between the p-type silicon (Si) substrate 11 and the gate insulating layer 12 is defined as the origin point, and the lower side from the gate insulating layer 12 is positive and the height direction of the gate electrode 13 is negative.

In the simulations for obtaining the above-described stress and distortion, the Young's moduli of the silicon oxide ($SiO_2$) of the first side wall 14a, the silicon (Si) of the p-type silicon (Si) substrate 11, the silicon nitride (SiN) of the second side wall 14b are set so as to be increased in that order. Specifically, the Young's modulus of silicon oxide ($SiO_2$) is set at 65 GPa; the Young's modulus of silicon (Si) is set at 130 GPa; and the Young's modulus of silicon nitride (SiN) is set at 200 GPa.

In FIG. 11C, the black square data 30a surrounded by a dashed line represents a value of stress σxx in the n-type MIS transistor 10', and the black square data 30e surrounded by a solid line represent a value of stress σxx in the n-type MIS transistor 20. In this figure, the black square data 30a surrounded by the dashed line represents a value of stress σxx along the z axis at the interface between the p-type silicon (Si) substrate 11 and the gate insulating layer 12. The black square data 30e surrounded by the solid line represents a value of stress σxx at a position 2 nm lower than the origin point of the interface between the p-type silicon (Si) substrate 11 and the gate insulating layer 12.

FIG. 11C compares the black square data 30a surrounded by the dashed line and the black square data 30e surrounded by the solid line. In the black square data 30a surrounded by the dashed line, the stress σxx in the n-type MIS transistor 10' at the interfaced between the p-type silicon (Si) substrate 11 and the gate insulating layer 12 was 0.28. In the black square data 30e surrounded by the solid line, the stress σxx in the n-type MIS transistor 20 was 0.31.

FIG. 11D is a graph illustrating distortions, or Exx, in the longitudinal direction (X direction: direction connecting the source region and the drain region) obtained by simulations using the n-type MIS transistor 10' and the n-type MIS transistor 20. In FIG. 11D, the black triangular data 30c surrounded by a dashed line represents the distortion Exx in the n-type MIS transistor 10', and the black triangular data 30f surrounded by a solid line represents the distortion Exx in the n-type MIS transistor 20. In this figure, the black triangular data 30c surrounded by the dashed line represents the value of distortion Exx along the z axis at the interface between the p-type silicon (Si) substrate 11 and the gate insulating layer 12. The black triangular data 30f surrounded by the solid line represents the value of distortion Exx at a position 2 nm lower than the origin point of the interface between the p-type silicon (Si) substrate 11 and the gate insulating layer 12.

FIG. 11D compares the black triangular data 30c surrounded by the dashed line and the black triangular data 30f surrounded by the solid line. While the distortion Exx of the black triangular data 30c surrounded by the dashed line is 0.0025 at the interface between the p-type silicon (Si) substrate 11 and the gate insulating layer 12 in the n-type MIS transistor 10', the distortion Exx of the black triangular data 30d surrounded by the solid line is 0.0027 in the n-type MIS transistor 20.

FIGS. 11C and 11D illustrate that the positive stress σxx (uniaxial stress) and distortion Exx in the X direction (direction connecting the source region and the drain region) in the n-type MIS transistor 20 are higher than those in the n-type MIS transistor 10'.

The stress σxx and distortion Exx pulling the channel region in the X direction are produced through the second side walls 14b when the stress film 16a shrinks in the manufacturing process of the n-type MIS transistor 20. It may be thought that since the n-type MIS transistor 20 includes the second side wall 14b of silicon nitride (SiN) at both ends of the channel region, the uniaxial stress and distortion in the X direction produced in the channel region are more increased than those in the n-type MIS transistor 10'. Since the distortion Exx contributes to the increase of the carrier mobility in the channel region, as illustrated in FIG. 5, the carrier mobility in the channel region of the n-type MIS transistor 20 may be increased.

In the MIS transistor and the method of manufacturing the MIS transistor, according to the second embodiment, the protrusion 11b of the MIS transistor has a lower height than that of the MIS transistor of the first embodiment. In addition, the first insulating layer 14c is formed lower than the height of the protrusion 11b by anisotropic etching. By reducing the height of the protrusion 11b, the extension regions 19 of the protrusion 11b may be more increased than those in the MIS transistor 10 of the first embodiment. Since the extension regions 19 of the protrusion 11b may be increased, the leakage current in the channel region may be reduced.

In the semiconductor device and the method of manufacturing the semiconductor device, according to the present embodiment, a second side wall having a higher Young's modulus than the silicon (Si) substrate is formed at both ends of the channel region. By forming the second side wall at both ends of the channel region, the uniaxial stress in the channel region may be increased.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A method of manufacturing a semiconductor device, comprising:
    forming a gate insulating film and a gate electrode over a silicon substrate;
    implanting first impurities into the silicon substrate using the gate electrode as a mask;
    implanting a second impurity into a surface of an implanted silicon substrate using the gate electrode as the mask;
    selectively removing the implanted surface of the silicon substrate so as to form a protrusion of the silicon substrate under the gate electrode, the protrusion having an upper surface and a side surface;
    forming a first insulating film on the gate electrode and the side surface of the protrusion;
    forming a second insulating layer on the first insulating layer;
    selectively removing the first and second insulating film such that at least a part of the first and second insulating film remains over the side surface of the protrusion of the silicon substrate to form the first side wall spacer with the first insulating film and the second sidewall spacer with the second insulating film, the second side wall spacer containing a material having first Young's modulus greater than second Young's modulus of the silicon substrate; and
    forming a stress film over the gate electrode and the second side wall spacer.

2. The method according to claim 1, further comprising implanting second impurities into the silicon substrate using the gate electrode, the first side wall spacer and the second side wall spacer as a mask.

3. The method according to claim 1, wherein
    the forming the first side wall spacer on the side surface of the protrusion, the first side wall spacer and
    the forming the second side wall spacer on the first side wall spacer, the second side wall spacer including the material having a Young's modulus greater than that of the silicon substrate further includes selectively removing the entire surface of the first insulating film such that the height of the surface of the first insulating film is lower than that of the upper surface of the protrusion of the silicon substrate.

4. The method according to claim 1, wherein the first side wall spacer is silicon oxide and the second side wall spacer is silicon nitride.

5. The method according to claim 3, the selectively removing the entire surface of the first insulating film such that the height of the surface of the first insulating film is lower than that of the upper surface of the protrusion of the silicon substrate is performed by anisotropic etching the first insulating film after forming the first insulating film over the silicon substrate.

6. The method according to claim 1, selectively removing the implanted surface of the silicon substrate to form a tapered surface having an inclination of 30 to 60 degrees.

* * * * *